United States Patent
Langan

[11] 4,078,156
[45] Mar. 7, 1978

[54] DRIFT CANCELLATION CIRCUIT FOR MULTIPLEXER AMPLIFIER

[75] Inventor: Marion J. Langan, Huntsville, Ala.

[73] Assignee: Avco Corporation, Huntsville, Ala.

[21] Appl. No.: 756,315

[22] Filed: Jan. 3, 1977

[51] Int. Cl.² ............................................. H04J 3/04
[52] U.S. Cl. ........................ 179/15 BL; 340/177 CA
[58] Field of Search ..................... 179/15 BL, 15 A; 340/177 CA, 183

[56] References Cited

U.S. PATENT DOCUMENTS

| 3,059,228 | 10/1962 | Beck | 179/15 BL |
| 3,619,511 | 11/1971 | Ishikawa | 179/15 BL |
| 4,056,686 | 11/1977 | Zielinski | 179/15 BL |

OTHER PUBLICATIONS

1970 Wescon Technical Papers, vol. 14, pp. 14/1-1 to 14/1-8; "A Low Level, High Speed, Solid State Multiplexer . . . " by Hartke.

Primary Examiner—David L. Stewart
Attorney, Agent, or Firm—Irwin P. Garfinkle; Robert J. McNair, Jr.

[57] ABSTRACT

Herein described is a drift cancellation circuit for signal amplifiers used in multiplexed data monitoring systems. The effect of analog drift is essentially cancelled and the need for an initial or periodic zero adjustment is eliminated. The elimination of the need for drift adjustment is accomplished at the analog to digital A/D converter of the mutiplexer. The A/D converter is encircuited to measure the difference between the measured input channel and a referenced voltage obtained from a sample-hold circuit. Input to the sample-hold circuit is taken from the output to the signal amplifier chain used in processing incoming channel data.

9 Claims, 2 Drawing Figures

DRIFT CANCELLATION CIRCUIT FOR MULTIPLEXER AMPLIFIER

BACKGROUND OF THE INVENTION

This invention relates to electronic circuitry which cancels out the effects of drift in the amplifiers of multiplexed data monitoring systems. Methods used heretofore required the use of very low drift amplifiers in order to avoid degradation of the analog signal accuracy in multiplexed data acquisition systems. In addition the previously existing systems required periodic readjustment of the zero balance adjustment point of the amplifiers. This was particularly true in low level analog signal monitoring equipment wherein the peak to peak swing in voltage at the input to one of the multiplexer channels is only a fraction of a volt.

It has been common practice in the multiplexing art to bring the several channels of sensor information in to a sequential data sampling unit. The sampling unit monitors each input channel for a short interval, then steps on to the next channel. After all channels have been sampled, the cycle is repeated. Each sample, thus monitored, is fed to a signal amplifier for appropriate processing. In other words the bandwidth and gain of the amplifier stage has to match the parameters of both the data pickup sensors and the sampling interval of the sequential channel sampler unit. The output of the amplifier stage or stages is usually passed on to an analog-to-digital (A/D) converter stage so that the signal input information content of each channel can be formatted in digital language for analysis in a digital computer. It will be understood that the operation of the A/D converter is synchronized with the channel sensor sampling unit. In such a system the amplifiers which process the pickup sensor signals for input to the A/D converter have to remain stable. It is necessary that the amplifiers have a low drift characteristic with respect to both time and temperature. The usual approach with such a system, is to initially adjust the amplifier to a calibrated status or zero-balance condition and then periodically readjust gain and other parameters to again achieve a calibrated state.

For further information relative to the general background of the invention, reference is made to the, "Handbook of Telemetry and Remote Control", by Elliott Gruenberg, published by McGraw-Hill, New York, 1967.

BRIEF SUMMARY OF INVENTION

My invention solves both the drift and calibration problems. At the same time use of my invention allows monitoring of sensor end instruments wherein the variable parameter may vary a fraction of a volt but this variation is floating on a dc voltage which is several hundred volts above ground.

The invention can best be explained by way of an example. Suppose that there are 12 channels of sensor data to be monitored. Further, suppose that 4 channels have sensors whose output varies within a range of ± 1 volt with no dc offset. Suppose that a second group of 4 channels contain sensors whose output varies between 99 and 101 volts with respect to ground. Finally, suppose that the output voltage on the final group of 4 channels varies between 199 and 201 volts. Thus, we have a multiplexed system wherein groups of analog signals are at significantly different potentials with respect to each other, but the signals can be divided into groups having small variations with respect to their neighbors within the group.

In the example set forth there were three such groups of sensor channels whose characteristics were similar. To accommodate the significantly different voltage potential with respect to ground between the groups, a separate amplifier section is used for each. Thus, the four input channels of group A are directed to one amplifier section, the four input channels of group B are directed to a second amplifier section, and the four input channels of group C are directed to a third amplifier section. Each of the amplifier sections has at its output an isolation amplifier. The isolation amplifier outputs are submultiplexed together to provide an input to the A/D converter. Isolation amplifiers are needed to reference each group to the common potential input of the A/D converter.

The system as described thus far is similar to many prior art systems. In my implementation, however, some further features are added. To each group of sensor channels, a reference voltage channel is added. In the example presented, channels 1, 6 and 11 would contain reference voltages, namely 0, 100 and 200 volts respectively. Group A data would be fed to channels 2 through 5; group B data to channels 7 - 10; and, group C data to channels 12 - 15. Additionally, the input to the amplifier section associated with each group has a differential type of input. This allows the reference voltage associated with that particular group to be used as the second input to the amplifier section. For example then, the reference voltage for group B channels was given as 100 volts. Thus, using a differential input the group B signal input to the amplifiers will be varying, in the given example, between 99 and 101 volts. The second or differential input to the amplifier will be 100 volts. Thus the amplifier acts as though the signal input varied between ± 1 volt.

A second and more important feature of my invention is to make use of a sample and hold circuit to correct for amplifier drift. This is implemented as follows. Each group of channels at the sensor sampler has, as the first channel in the group, a reference signal channel. The potential of the reference channel input is the same as the differential input of the associated group amplifier. For the example used above, this would mean that the reference channel of group A is zero volts, that of group B is 100 volts and that of group C is 200 volts. This reference signal is used as follows. During the interval when the multiplexer is sampling the reference channel of group A, there will be some sort of output from the isolation amplifier associated with the group. If the amplifiers have not drifted, the output should be zero during this interval. However, if something has drifted, there may be a measurable output. Whatever, the level of the output is stored in a sample and hold circuit. The output of the sample and hold circuit serves as the reference input to the A/D converter during the remainder of the interval over which the multiplexer spends in sampling data from the group A channels.

When the reference channel of group B signals is sampled, a new sample and hold voltage value is taken, this one coming from the output of the group B isolation amplifier. This sample is held for the remainder of the group B data interval.

Now as each reference channel is sampled, the resulting output from the isolation amplifier is stored in the sample and hold circuit for the remainder of the group sampling interval. On this basis the output of the A/D converter will read zero volts during the sampling of each reference channel since the signal input line of the A/D converter contains exactly the same information as its second or reference input which is being generated by the sample and hold circuit.

Thus, with my implementation the output of the A/D converter will accurately depict the magnitude and polarity of the signal voltages being supplied by the sensors. Accuracy remains constant regardless of the initial zero setting of the amplifiers or subsequent drift due to circuit or temperature variables.

DETAILED DESCRIPTION OF THE INVENTION

Figure 1:
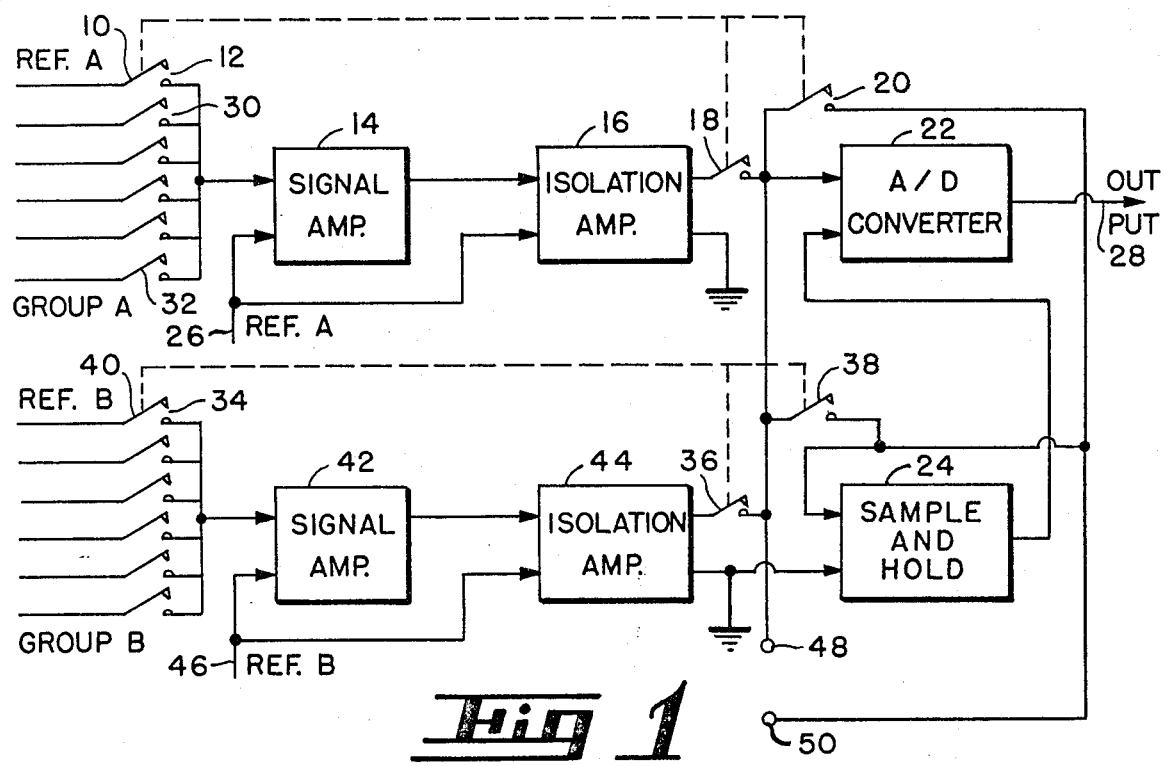
FIG. 1 is a block diagram of the preferred form of the invention.

FIG. 1 shows a block diagram of a data monitoring system having my invention incorporated therein. The system is shown as having 10 input data channels. These are shown as divided into Group A and Group B channels. If it is assumed that the channel multiplexer sequentially samples the data inputs from top to bottom as viewed in FIG. 1, then the first channel sampled will be signal line 10 which contains reference voltage A. Sampling of channel one is accomplished by closing of switch 12. With switch 12 closed, the data on signal line 10 will be transferred to Signal Amplifier 14. In the unit reduced to practice Signal Amplifier 14 was a linear integrated circuit No. CA741. Other types of semiconductors would function as well. The main criteria is to have high gain and fast transient response.

As for the signal multiplexer, the particular implementation will depend on number of channels being sampled and sampling rate. In the early days of telemetry, rotary switches were used almost exclusively. More recently, diode switching matrices have been found useful as signal multiplexers. The costs of implementation, sampling time and accuracy demanded are usual governing factors in setting up a particular system.

The output of Signal Amplifier 14 drives Isolation Amplifier 16. The isolation amplifier in the system reduced to practice was a floating differential input chopper amplifier of the type disclosed in U.S. Pat. No. 3,612,903. The chopper amplifier disclosed therein has an input which floats with respect to system output ground and means is provided to balance the chopper circuit without creating a leakage path between the differential signal input and the output ground.

The output of amplifier 16 terminates at switch 18. Closure of switch 18 is synchronized with the closure of switch 12. Once closed, however, switch 18 remains closed during the entire interval that the multiplexer spends in sampling group A channels. Also, simultaneously with the closure of switch 12, there is also a closure of switch 20. Switch 20, however, remains closed only during the interval that switch 12 is closed.

Thus during the interval that switch 12 is passing Ref A signal data on to amplifier 14, there is an output from amplifier 16 into both A/D converter 22 and sample-and-hold circuit 24. Since the output of sample-and-hold circuit 24 serves as the negative input to the A/D converter there will be a zero output from converter 22 during the sampling of Ref A on line 10.

FIG. 1 shows additionally that amplifiers 14 and 16 are of the differential input type wherein the Ref A voltage is fed to both amplifiers via line 26. The Ref A voltage fed via line 26 to the differential inputs of amplifiers 14 and 16 is identical with the Reference A voltage present on input channel line 10. Therefore, during the interval that multiplexer switch 12 is closed, the only signal present at switch 18 is that due to amplifier drift or mis-calibration. Even then the use of the sample-hold circuit 24 cancels out the residual at the output of A/D converter 22.

In the unit reduced to practice A/D converter 22 was a digital voltmeter having a floating isolated input. A typical instrument of this type is the Acurex Model 502B auto-data unit. Instruments of this type have both a visual readout and a digital word output 28 which can be used to input data into a computer.

After the interval is passed during which switch 12 is closed, the multiplexer advances to close switch 30. However, simultaneous with the opening of switch 12, switch 20 opens, leaving the effects of the reference signal stored in the sample-hold circuit 24. The amplified signal content of the information being passed by switch 30 will be transferred through switch 18 which remains closed for the entire interval Group A channels are being sampled. The processed signal data passed by switch 30 thus serves as one output to A/D converter 22. The second input to the A/D converter 22 is the held value stored in sample-hold circuit 24. The magnitude of the difference signal present across the two input terminals of A/D converter 22 is measured and transmitted as a digital word along output line 28.

The other channels comprising Group A are similarly sampled and measured in turn by A/D converter 22. The multiplexer samples each Group A data line in sequence with switch 32 being the last to close. At the conclusion of the switch 32 sampling intervals, both switch 32 and switch 18 open.

The multiplexer/amplifier combination is now ready to process Group B channel data. For processing of the Group B channels, the multiplexer first closes switch 34. In synchronism with the closing of switch 34, switches 36 and 38 close. Switches 36 and 38 function in the same manner as their respective counterparts, switches 18 and 20, used with processing of Group A channel data. This means that switch 38 remains closed for the same time interval as does switch 34. Thus during the interval switch 34 is closed Ref B potential 40 is processed by signal amplifier 42 and isolation amplifier 44 and serves to charge sample-hold circuit 24 to a new level. The new value in sample-hold circuit 24 exactly compensates for the accumulated drift in signal amplifier 42 and isolation amplifier 44. The differential inputs of amplifiers 42 and 44 are fed Ref B voltage via line 46.

With a new compensating value now stored in sample-hold circuit 24, the multiplexer will proceed to step through the rest of the Group B data input channels. All processed Group B channel data passes through closed switch 36 and into A/D converter 22. The difference between the newly held value in sample-hold circuit 24 and the voltage passing through switch 36 will be measured by A/D converter 22 for outputting on line 28.

After all Group B data channels have been sequentially sampled, processed and measured, the multiplexer will step on to the next group. The next group of channels could be either a Group C set (not shown) or a return to the Group A channels. For each group of multiplexed channels in addition to the two groupings shown in FIG. 1, there would be a signal amplifier and an isolation amplifier. Each additional group would be arranged in the same manner as the A&B channel groups shown in FIG. 1. The output of an additional group of channels would be passed by a switch similar to switch 36 into terminal 48. There would be another reference voltage associated with the new group. During the interval that the multiplexer samples the reference voltage of the new group, a sample will be switched in at terminal 50 for storage in sample-hold circuit 24.

For most system implementations switches 18, 20, 36 and 38 will be encircuited as part of a sub-multiplexer which steps in synchronism with the data channel sampling multiplexer shown in FIG. 1 as switch contacts 12, 30 et sequitor.

Figure 2:
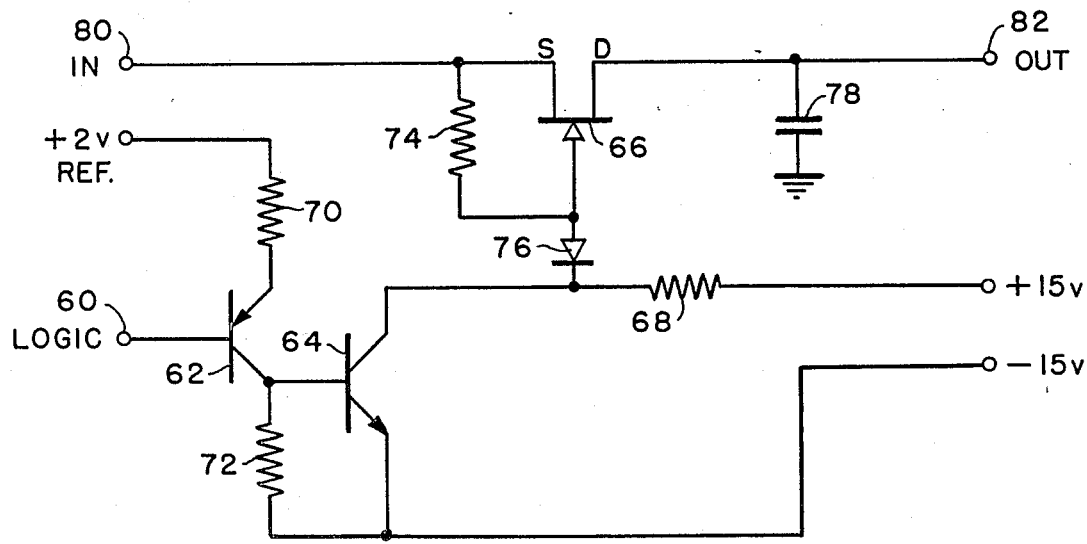
FIG. 2 is a circuit schematic of the sample and hold circuit which forms a part of this invention.

The schematic of a typical sample-and-hold circuit is shown in FIG. 2. When the logic input 60 is zero volts, transistors 62 and 64 conduct. This causes junction field effect transistor 66 to be biased to an "off" condition by a voltage of approximately −14 volts if resistor 68 has a value of 1 megohm. Typically, the components of FIG. 2 are nomenclatured as follows:

Resistors 68 & 74 — 1 megohm
Resistors 70 & 72 — 10 K
Diode 76 — 1N914
Transistor 62 — 2N3906
Transistor 64 — 2N3904
FET 66 — U 1899
Capacitor — 1 microfarad (typical)

When logic input 60 is switched to +5 volts, transistors 62 and 64 are cut off, diode 76 is back biased +15 volts and FET 66 is turned "on" due to the connection of the Gate and Source terminals by resistor 74. In the "on" condition, the resistance of FET 66 from Source to Drain is nominally 100 ohms. In the "off" condition, the resistance from Source to Drain jumps to approximately $10^{14}$ ohms. Thus, with the FET gated "on" capacitor 78 quickly charges to the voltage fed in at terminal 80. Then, at the end of the sampling period, the FET is gated "off" and very little leakage occurs to alter the held value of charge on capacitor 78. The output at terminal 82 serves as the input to the A/D converter. Capacitor 78 is shown as having a value of 1 microfarad. This value may vary significantly depending on both the multiplexing frequency and the input impedance of the A/D converter.

Differential multiplexing and amplification are often used in the handling of low level analog signals having a full scale range of 10 millivolts or less. For such low level signals, each channel of sensed data may come in on a pair of lines. The multiplexer switches in both lines at once, one line going to the non-inverting input of the differential amplifier, the other going to the inverting input. Here again use of a reference signal channel will compensate for any drift in the data acquisition system. For the differential multiplexed case, the reference signal must be simultaneously inputted into both the inverting and non-inverting inputs of the amplifier. In reality this is no different than having the Ref A voltage simultaneously injected into signal amplifier 14 (See FIG. 1) via line 26 and switch 12. While the above description serves to describe the basic philosophy of the invention, it should be understood that the embodiment is not at all restricted to the specific configuration illustrated. For example, in FIG. 1 where an Analog to Digital Converter is shown, an analog meter or chart recorder may be used. This invention is of particular value when considered with respect to large systems made up of a quantity of remotely located multiplexers with each multiplexer working into a high gain amplifier in order to transmit analog voltages at a high level so as to avoid degradation of accuracy due to noise. Without the proposed drift cancellation circuitry, the necessity exists for expensive, chopper stabilized amplifiers and/or frequent visits to each multiplexer site (which may be highly inaccessible) for the purpose of amplifier zero adjustment.

I claim:

1. A multiplexed data monitoring system for converting the input signal on each channel of a plurality of parallel data channels into a sequence of measured data output samples, the combination comprising:
    a reference signal having a magnitude approximately equal to the mean of said input signals;
    a differential signal amplifier section, said differential amplifier section having first and second input terminals, and an output terminal;
    means during a first period for applying said reference signal simultaneously to said first and second input terminals of said differential amplifier section;
    a sample and hold circuit;
    means for applying the output of the differential amplifier section to said sample and hold circuit during said first period;
    a signal measuring unit having first and second input terminals isolated with respect to ground;
    means applying the output of said sample and hold circuit to one of said terminals;
    means for subsequently sequentially applying said input signals to said first input terminal of said differential amplifier section; and
    means for applying the output signal from said differential amplifier section to the other input terminal of said signal measuring unit.

2. A multiplexed data monitoring system as defined in claim 1 wherein said amplifier section comprises a high gain differential amplifier input stage followed by an isolation amplifier having an input which floats with respect to system output ground.

3. A multiplexed data monitoring system as defined in claim 1 wherein said signal measuring unit comprises an analog to digital converter having a digital bit stream output.

4. A multiplexed data monitoring system as defined in claim 1 wherein said signal measuring unit comprises a strip chart recorder.

5. A multiplexed data monitoring system as defined in claim 1 wherein said means for sequentially applying said input signal to said first input terminal includes a signal multiplexer.

6. The invention as defined in claim 5 wherein said signal multiplexer is a differential multiplexer.

7. A multiplexed data monitoring system for converting the input signals on each channel of a plurality of parallel data channels into a sequence of measured data output samples, the combination comprising:
    a multiplexer for sequentially sampling sensor information from a plurality of data channels;
    means for arranging said data channels into groups having similar characteristics;
    a reference signal for each of said groups of data channels, each of said reference signals having a magnitude equal to the mean of the signals in said respective group of data channels;

a plurality of signal amplifier sections, one each of said amplifier sections being encircuited to process the signals within each of said group of data channels, each of said signal amplifier sections having first and second input terminals and an output terminal, one of said input terminals being of the non-inverting type, the second of said input terminals being of the inverting type;

programming means for having said multiplexer process in sequence all sensor information from one group of data channels before stepping on to the next group, the time required for such process being a group interval;

means during a first period in each of said group intervals, for applying said respective reference signal to said first input terminal of said amplifier section;

means for applying to the second input terminal of each of said signal amplifier sections the reference signal associated with that group of data channels;

a sample and hold circuit having an input and an output;

a signal measuring unit having first and second input terminals and an output terminal, said input terminals being isolated with respect to ground;

means applying the output of said sample and hold circuit to the second input of said signal measuring unit;

first submultiplexing means for sequentially applying the output of each of said group amplifier sections to the input of said sample and hold circuit during the first period of each of said group intervals; and second submultiplexing means for sequentially applying the output of each of said group amplifier sections to the first input terminal of said signal measuring unit, said submultiplexer acting in time synchronization with said multiplexer.

8. The invention as defined in claim 7 wherein each of said amplifier sections comprises a high gain differential amplifier stage followed by an isolation amplifier having an input which floats with respect to system output ground.

9. The invention as defined in claim 7 wherein said signal measuring unit comprises an analog to digital converter having a digital bit stream type output.

* * * * *